United States Patent
Chu et al.

(10) Patent No.: US 10,290,725 B2
(45) Date of Patent: May 14, 2019

(54) BIPOLAR JUNCTION TRANSISTOR AND INTEGRATED CIRCUIT DEVICE

(71) Applicant: Taiwan Semiconductor Manufacturing Co., Ltd., Hsinchu (TW)

(72) Inventors: Chung-Hao Chu, Hsinchu (TW); Chi-Feng Huang, Hsinchu County (TW); Chia-Chung Chen, Keelung (TW); Victor Chiang Liang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 100 days.

(21) Appl. No.: 15/465,600

(22) Filed: Mar. 22, 2017

(65) Prior Publication Data

US 2018/0277666 A1    Sep. 27, 2018

(51) Int. Cl.
*H01L 29/06* (2006.01)
*H01L 29/739* (2006.01)
*H01L 27/088* (2006.01)
*H01L 29/08* (2006.01)
*H01L 29/66* (2006.01)
*H01L 29/16* (2006.01)
*H01L 29/26* (2006.01)
(Continued)

(52) U.S. Cl.
CPC ...... *H01L 29/7393* (2013.01); *H01L 27/0886* (2013.01); *H01L 29/0657* (2013.01); *H01L 29/0808* (2013.01); *H01L 29/0821* (2013.01); *H01L 29/66068* (2013.01); *H01L 29/66325* (2013.01); *H01L 29/161* (2013.01); *H01L 29/1608* (2013.01); *H01L 29/26* (2013.01); *H01L 29/6625* (2013.01); *H01L 29/735* (2013.01)

(58) Field of Classification Search
CPC . H01L 29/08; H01L 29/0808; H01L 29/7393; H01L 29/06; H01L 29/78; H01L 29/66; H01L 29/76; H01L 29/165; H01L 29/417; H01L 29/41766; H01L 29/66795; H01L 29/0653; H01L 29/6656; H01L 29/41791; H01L 29/7851; H01L 29/0649; H01L 29/0692; H01L 29/7848; H01L 29/66553; H01L 29/6653; H01L 29/7853; H01L 27/092; H01L 27/0924
USPC .......................................................... 257/77
See application file for complete search history.

(56) References Cited

U.S. PATENT DOCUMENTS 8,115,280 B2    2/2012  Chen et al.
8,373,229 B2    2/2013  Chen et al.
9,613,949 B1 *  4/2017  Pan .................... H01L 27/0635
(Continued)

*Primary Examiner* — Chuong A Luu
(74) *Attorney, Agent, or Firm* — JCIPRNET

(57) ABSTRACT

A bipolar junction transistor includes a semiconductor substrate, a fin structure, an epitaxial emitter, an epitaxial collector and a gate. The fin structure is disposed on the semiconductor substrate and has a base portion of a first conductivity type, a first recessed portion and a second recessed portion. The epitaxial emitter of a second conductivity type is disposed in the first recessed portion of the fin structure. The epitaxial collector of the second conductivity type is disposed in the second recessed portion of the fin structure. The gate is disposed on the base portion of the fin structure and isolated from the base portion of the fin structure.

19 Claims, 22 Drawing Sheets

(51) Int. Cl.
   *H01L 29/161* (2006.01)
   *H01L 29/735* (2006.01)

(56) References Cited

U.S. PATENT DOCUMENTS

2012/0264269 A1* 10/2012 Ke ..................... H01L 29/73
                                                    438/309
2015/0263091 A1*  9/2015 Hashemi ............ H01L 29/1008
                                                    257/191

* cited by examiner

BIPOLAR JUNCTION TRANSISTOR AND INTEGRATED CIRCUIT DEVICE

BACKGROUND

A bipolar junction transistor (BJT) includes a base, a collector, and an emitter. BJTs are formed by two p-n junctions placed back-to-back, with one of the regions common to both junctions. This forms either a PNP or NPN bipolar junction transistor. In BJTs, the current flow through the emitter and collector is controlled by the voltage across the base and emitter. As the semiconductor industry has progressed into nanometer technology process nodes in pursuit of higher device density, higher performance, and lower costs, various techniques have been implemented to improve BJT device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1I are perspective views of a method for fabricating a PNP BJT (PBJT) in accordance with some embodiments.

FIGS. 2A-2I are perspective views of a method for fabricating a NPN BJT (NBJT) in accordance with some embodiments.

FIG. 3A is a cross-sectional view of the PNP BJT taken along line A-A' in FIG. 1H and FIG. 3B is a cross-sectional view of the PNP BJT taken along line A-A' in FIG. 1I.

FIG. 4A is a cross-sectional view of the NPN BJT taken along line A-A' in FIG. 2H. FIG. 4B is a cross-sectional view of the NPN BJT taken along line A-A' in FIG. 2I.

FIG. 5 is a top view of an integrated circuit device of in accordance with some embodiments.

FIG. 6 is a top view of an integrated circuit device of in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of a BJT. The BJT may be formed on bulk silicon substrates in certain embodiments of the present disclosure. Still, the BJT may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

FIGS. 1A-1I are perspective views of a method for fabricating a PNP BJT (PBJT) in accordance with some embodiments and FIGS. 2A-2I are perspective views of a method for fabricating an NPN BJT (NBJT) in accordance with some embodiments.

Referring to FIG. 1A and FIG. 2A, a semiconductor substrate 100 is provided. In some embodiments, the semiconductor substrate 100 includes a crystalline silicon substrate (e.g., wafer). The semiconductor substrate 100 may comprise n-type doped regions and p-type doped regions depending on design requirements. For example, in FIG. 1A, the semiconductor substrate 100 comprises an n-well 101*a* which is doped with n-type dopants while the semiconductor substrate 100 shown in FIG. 2A comprises a p-well 101*b* which is doped with p-type dopants. The p-type dopants may be boron or $BF_2$ or combinations thereof while the n-type dopants may be phosphorus, arsenic or combinations thereof. In some alternative embodiments, the semiconductor substrate 100 including n-type and p-type doped regions may be made of other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 102*a* and a mask layer 102*b* are sequentially formed on the n-well 101*a* (shown in FIG. 1A) and p-well 101*b* (shown in FIG. 2A) of the semiconductor substrate 100. The pad layer 102*a* may be a silicon oxide thin film formed, for example, by thermal oxidation process. The pad layer 102*a* may act as an adhesion layer between the semiconductor substrate 100 and mask layer 102*b*. The pad layer 102*a* may also act as an etch stop layer for etching the mask layer 102*b*. For example, the mask layer 102*b* is a silicon nitride layer formed by low-pressure chemical vapor deposition (LPCVD) or plasma enhanced chemical vapor deposition (PECVD). The mask layer 102*b* is used as a hard mask during subsequent photolithography processes. Then, a patterned photoresist layer 104 having a predetermined pattern is formed on the mask layer 102*b*.

Referring to FIGS. 1A-1B and FIGS. 2A-2B, the mask layer 102*b* and the pad layer 102*a* which are not covered by the patterned photoresist layer 104 are sequentially etched to form a patterned mask layer 102*b*' and a patterned pad layer 102*a*' so as to expose underlying the n-well 101*a* (shown in 1B) and the p-well 101*b* (shown in 2B). Portions of the n-well 101*a* (shown in 1B) on the semiconductor substrate 100 exposed by the patterned mask layer 102*b*', the patterned pad layer 102*a*' and the patterned photoresist layer 104 are etched to form trenches 106, and portions of the p-well 101*b*

Figure 1A:
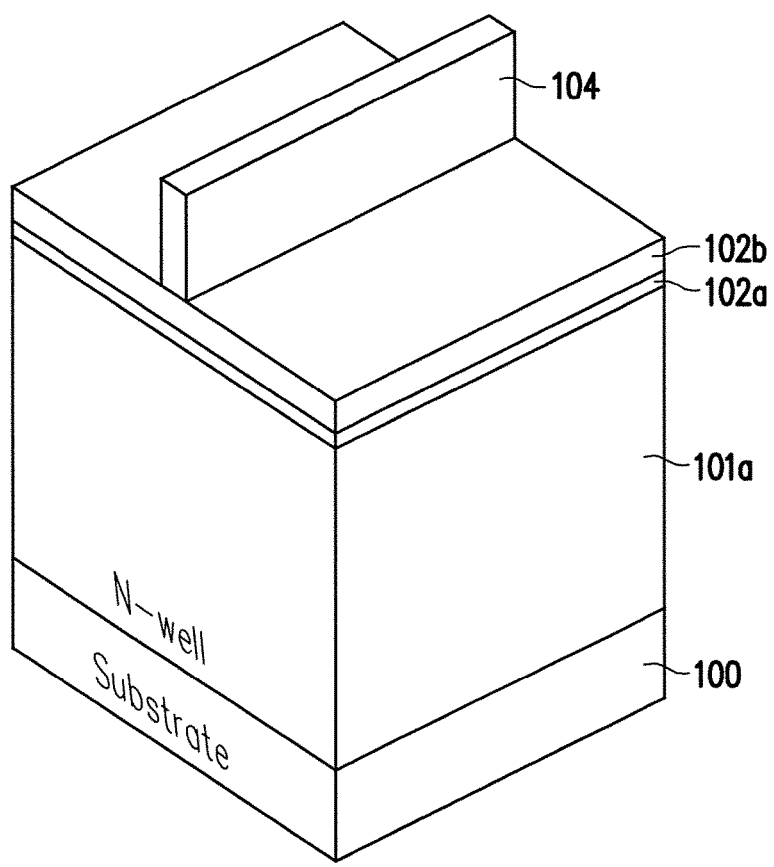
Figure 1B:
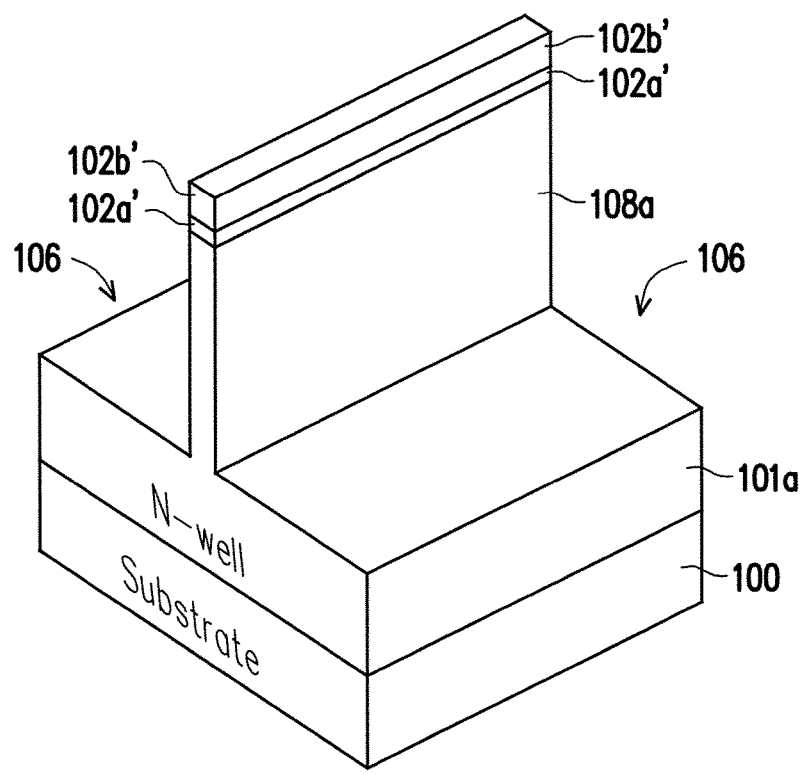
Figure 1C:
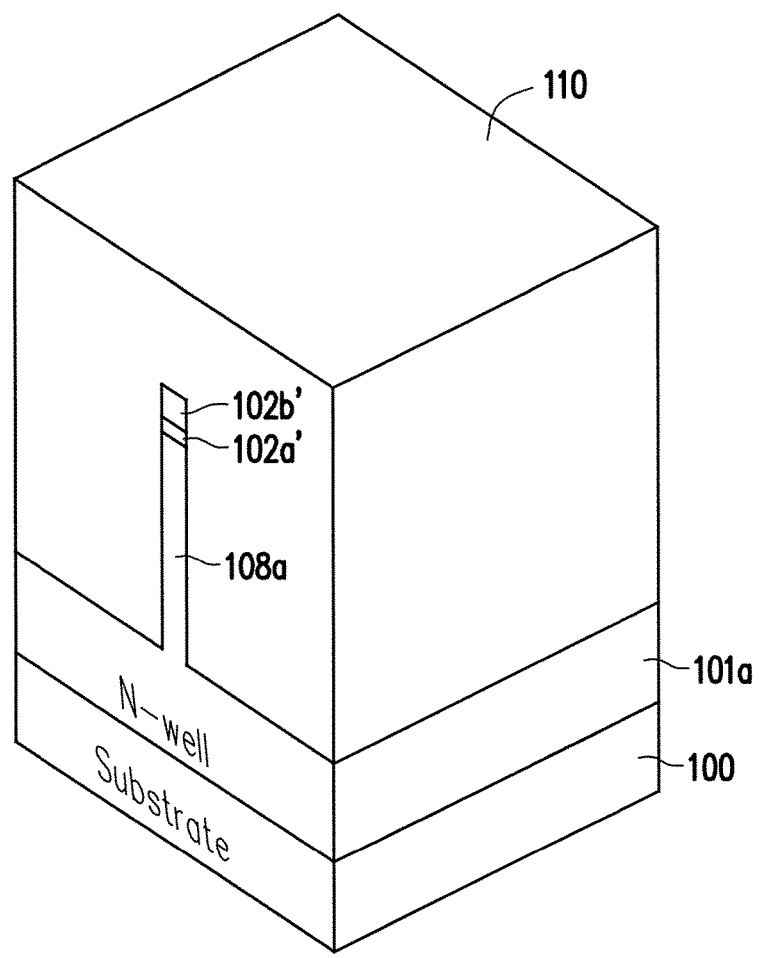
Figure 2A:
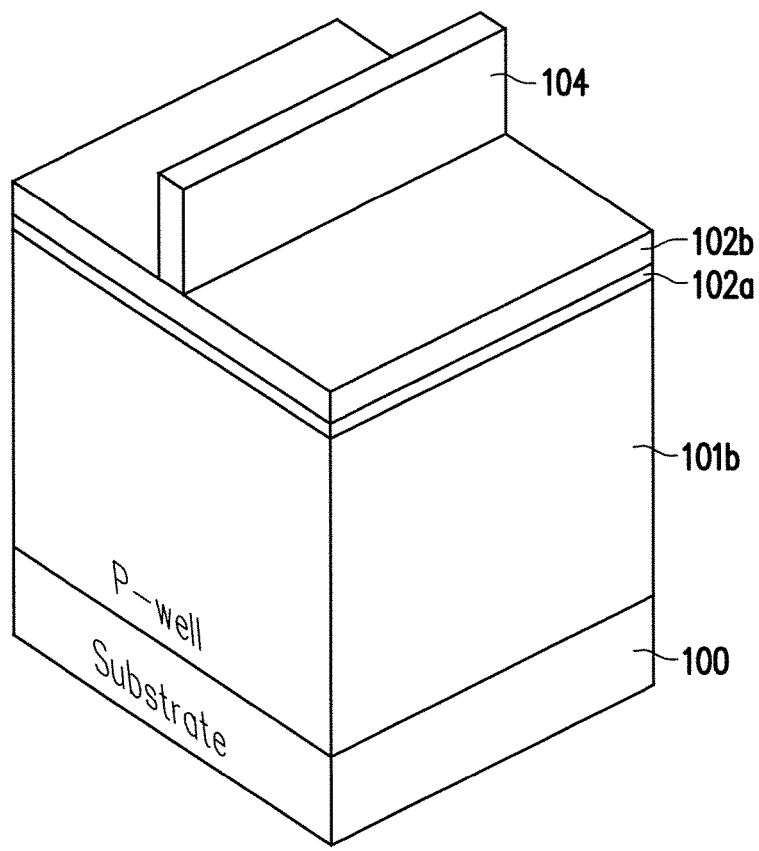
Figure 2B:
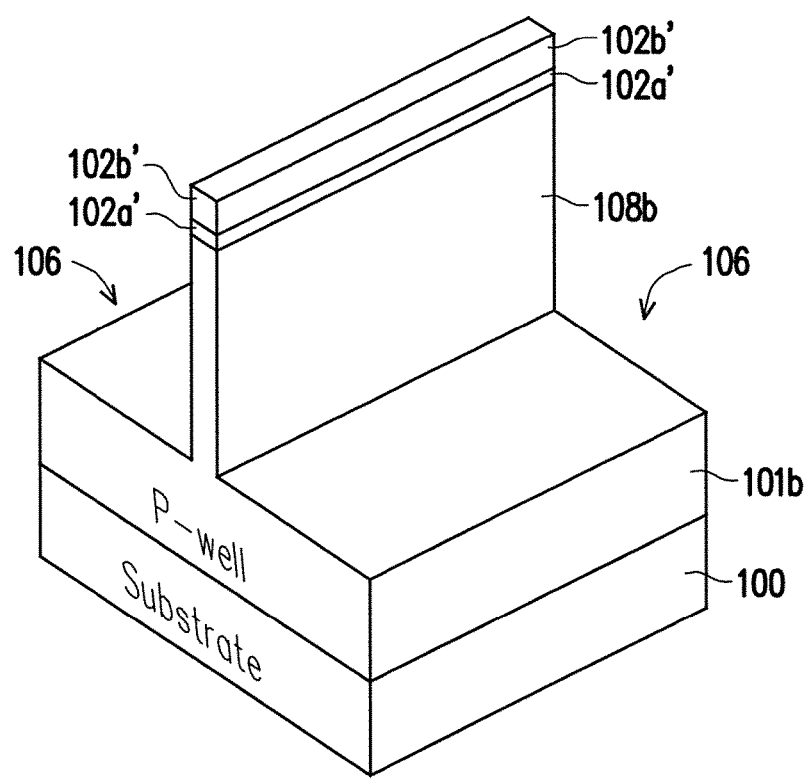

(shown 2B) on the semiconductor substrate 100 exposed by the patterned mask layer 102b', the patterned pad layer 102a' and the patterned photoresist layer 104 are etched to form trenches 106. Thus, at least one first fin structure 108a is formed (shown in FIG. 1B) and at least one second fin structure 108b of is formed (shown in FIG. 2B). The first fin structure 108a is an n-type fin structure and the second fin structure 108b is a p-type fin structure. The number of the first fin structure 108a shown in FIG. 1B and the second fin structure 108b shown in FIG. 2B is merely for illustration, in some alternative embodiments, two or more first fin structures 108a and second fin structures 108b may be formed in accordance with actual design requirements. Two adjacent trenches 106 formed in the n-well 101a (shown in FIG. 1B) of the semiconductor substrate 100 are spaced from each other by the first fin structure 108a and two adjacent trenches 106 formed in the p-well 101b (shown in FIG. 2B) of the semiconductor substrate 100 are spaced from each other by the second fin structure 108b.

The height of the first and second fin structures 108a, 108b and the depth of the trench 106 range from about 5 nm to about 500 nm. After the first fin structure 108a, the second fin structure 180b and the trenches 106 are formed, the patterned photoresist layer 104 is then removed. In one embodiment, a cleaning process may be performed to remove a native oxide of the patterned semiconductor substrate 100a. The cleaning process may be performed using diluted hydrofluoric (DHF) acid or other suitable cleaning solutions.

Figure 2C:
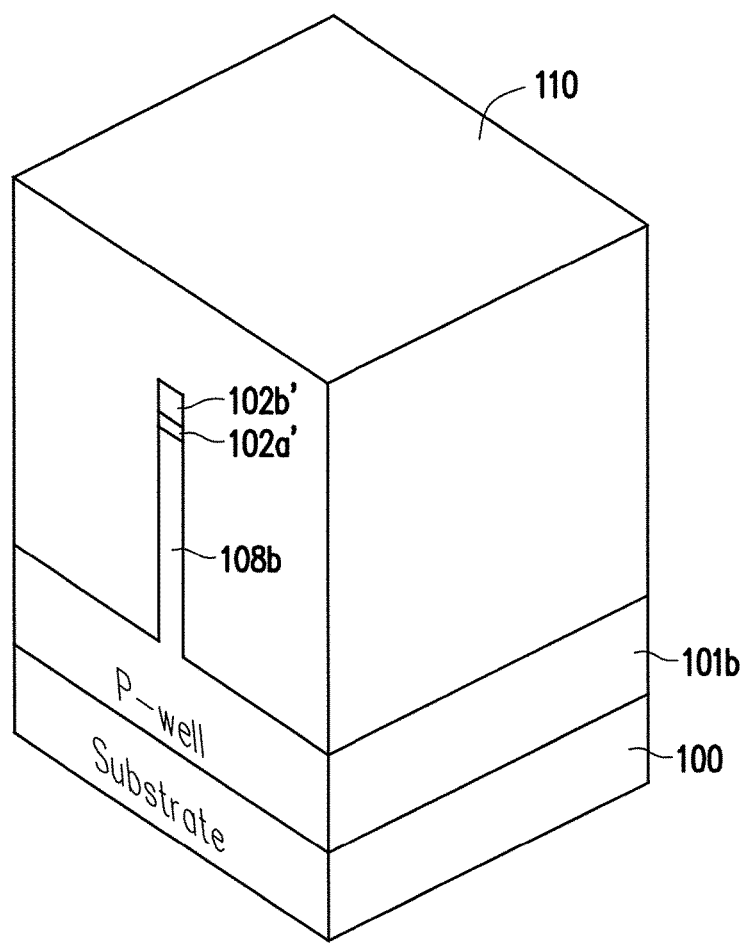

Referring to FIGS. 1B-1C and FIGS. 2B-2C, an insulating material 110 is formed over the n-well 101a of the semiconductor substrate 100 to cover the first fin structure 108a (shown in FIG. 1C), and the insulating material 110 is formed over the p-well 101b of the semiconductor substrate 100 to cover the second fin structure 108b (shown in FIG. 2C). Furthermore, the insulating material 110 fills the trenches 106. In addition to the first fin structure 108a and the second fin structure 108b, the insulating material 110 further covers the patterned pad layer 102a' and the patterned mask layer 102b'. The insulating material 110 includes silicon oxide, silicon nitride, silicon oxynitride, a spin-on dielectric material, or a low-K dielectric material, for example. The insulating material 110 may be formed by high-density-plasma chemical vapor deposition (HDP-CVD), sub-atmospheric CVD (SACVD) or spin-on.

Figure 1D:
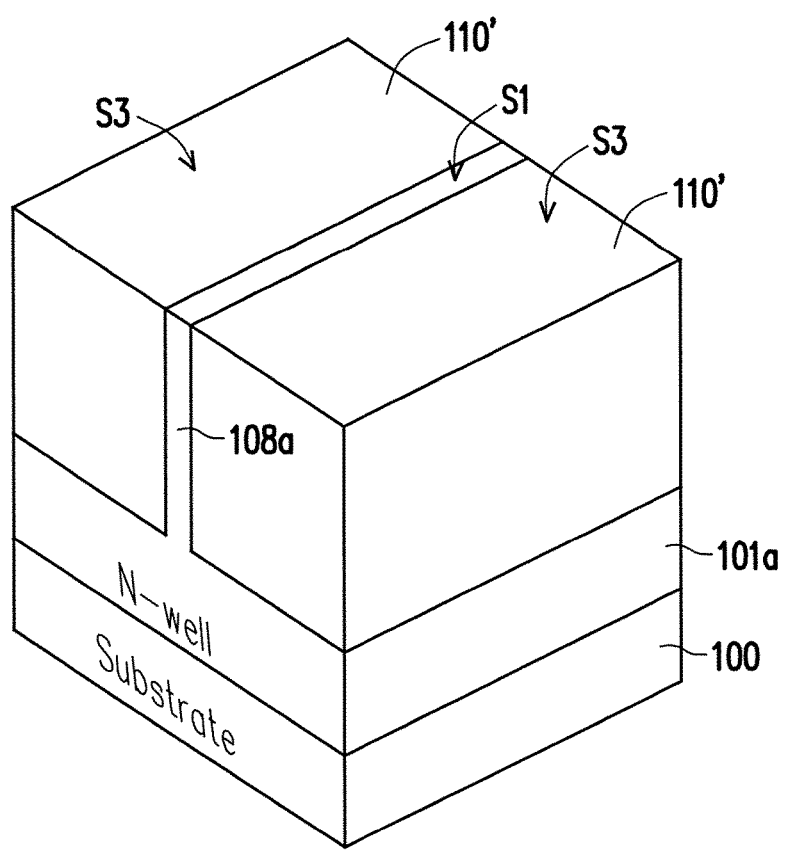
Figure 2D:
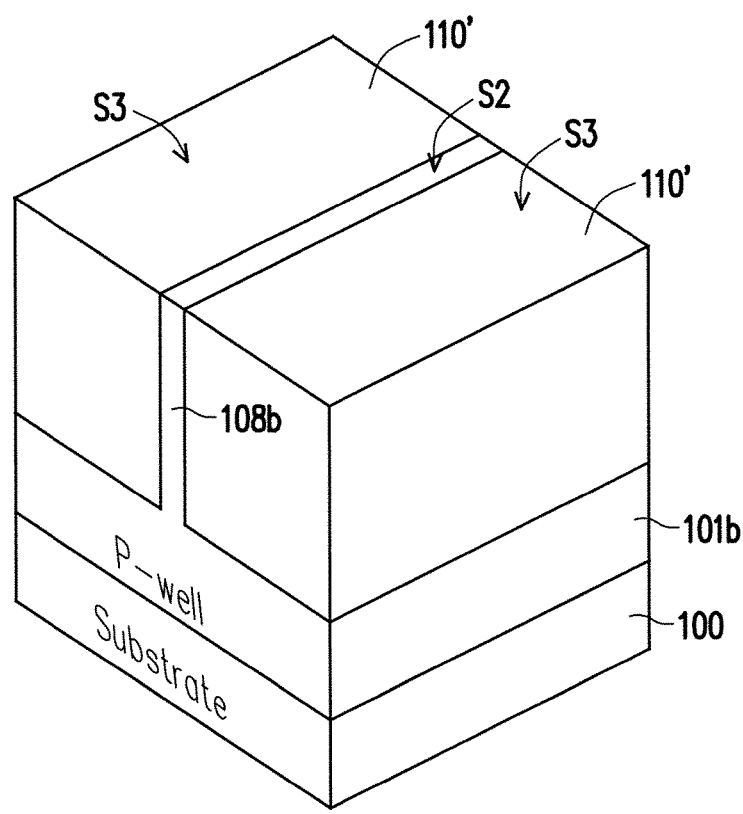

Referring to FIGS. 1C-1D and FIGS. 2C-2D, a chemical mechanical polish process is, for example, performed to remove a portion of the insulating material 110, the patterned mask layer 102b' and the patterned pad layer 102a' until the top surface S1 of the first fin structure 108a and the top surface S2 of the second fin structure 108b are exposed. As shown in FIG. 1D and FIG. 2D, after the insulating material 110 is polished, a polished insulating material 110' is formed and top surfaces S3 of the polished insulating material 110' are substantially coplanar with the top surface S1 of the first fin structure 108a and the top surface S2 of the second fin structure 108b.

Figure 1E:
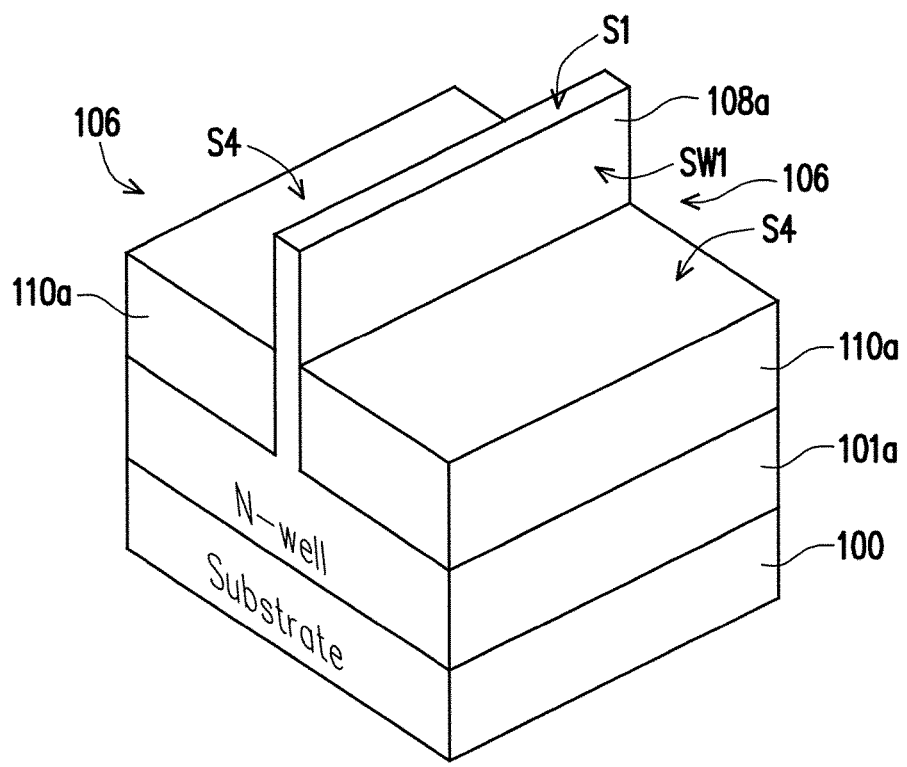
Figure 2E:
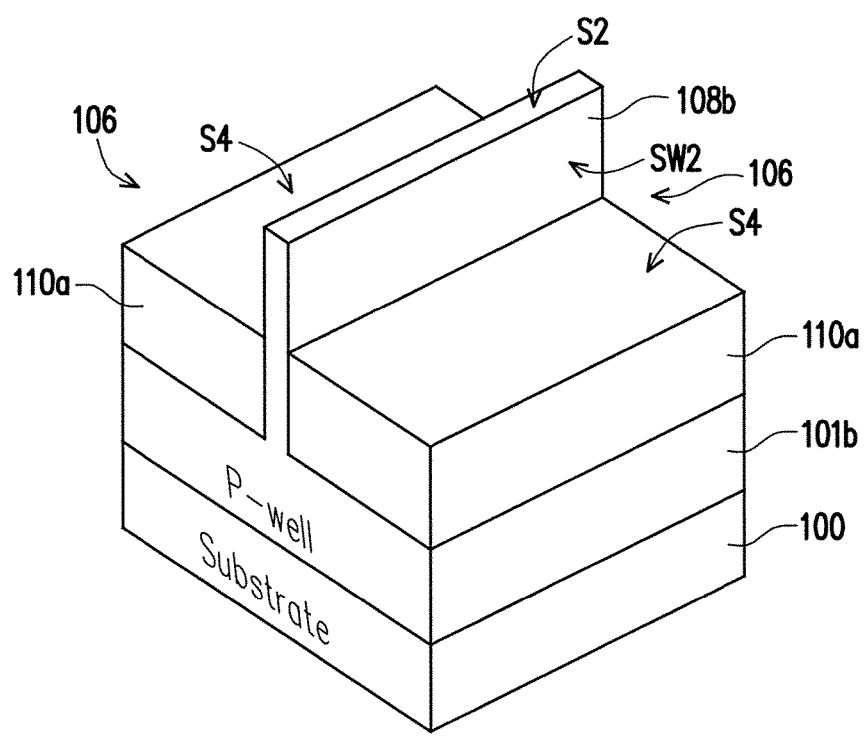

Referring to FIGS. 1D-1E and FIGS. 2D-2E, the polished insulating material 110' is partially removed by an etching process such that insulators 110a are formed on the n-well 101a (as shown in FIG. 1E) and the p-well 101b (as shown in FIG. 2E), and each insulator 110a is located in one of the trenches 106 correspondingly. In some embodiments, the etching process may be a wet etching process with hydrofluoric acid (HF) or a dry etching process. Top surfaces S4 of the insulators 110a are lower than the top surface S1 of the first fin structure 108a and the top surface S2 of the second fin structure 108b. In other words, the first and second fin structures 108a, 180b protrude from the top surfaces S4 of the insulators 110a and sidewalls SW1, SW2 of the fin structures 108a, 108b are thus exposed.

Referring to FIGS. 1E-1F and FIGS. 2E-2F, after the insulators 110a are formed, a first gate stack GS1 and a second gate stack GS2 are formed to partially cover the first fin structure 108a and the second fin structure 108b respectively. In other words, portions of the first fin structure 108a and the second fin structure 108b and portions of the insulators 110a are exposed.

In some embodiments, the first gate stack GS1 includes a first gate 120a, a first gate dielectric layer 112a, a first cap layer 124a and a pair of first spacers 116a while the second gate stack GS2 includes a second gate 120b, a second gate dielectric layer 112b, a second cap layer 124b and a pair of second spacers 116b. The first gate 120 is disposed over the first gate dielectric layer 112a. The first gate dielectric layer 112a partially covers the first fin structure 108a and is sandwiched between the first fin structure 108a and the first gate 120. The first cap layer 124a covers the top surface of the first gate 120a. The pair of first spacers 116a is disposed over the first gate dielectric layer 112a and extends along sidewalls of the first gate 120. The second gate 120b is disposed over the second gate dielectric layer 112b. The second gate dielectric layer 112b partially covers the second fin structure 108b and is sandwiched between the second fin structure 108b and the second gate 120b. The second cap layer 124b covers the top surface of the second gate 120b. The pair of second spacers 116b is disposed over the second gate dielectric layer 112b and extends along sidewalls of the second gate 120b.

In some embodiments, the first gate dielectric layer 112a and the second gate dielectric layer 112b are made from the same dielectric material, for example. The first gate dielectric layer 112a and the second gate dielectric layer 112b may include silicon oxide, silicon nitride, silicon oxy-nitride, or high-k dielectrics. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In one embodiment, the gate dielectric layer 112 is a high-k dielectric layer with a thickness in the range of about 0.2 nm to 50 nm. The first gate dielectric layer 112a and the second gate dielectric layer 112b may be formed by a suitable process such as atomic layer deposition (ALD), chemical vapor deposition (CVD), physical vapor deposition (PVD), thermal oxidation or UV-ozone oxidation.

The first gate 120a is formed on the first gate dielectric layer 112a. The second gate 120b is formed on the second gate dielectric layer 112b. In some embodiments, the first gate 120a and the second gate 120b may comprise a single layer or multi-layered structure. In some embodiments, the first gate 120a and the second gate 120b may comprise poly-silicon or metal, such as Al, Cu, W, Ti, Ta, TiN, TiAl, TiAlN, TaN, NiSi, CoSi, other conductive materials with a work function compatible with the semiconductor substrate material, or combinations thereof. In some embodiments, the first gate 120a and the second gate 120b includes a silicon-containing material, such as poly-silicon, amorphous silicon or a combination thereof. In some embodiments, the first gate 120a and the second gate 120b comprise a thickness in the range of about 30 nm to about 60 nm. The first gate 120a and the second gate 120b may be formed using a suitable process such as ALD, CVD, PVD, plating, or combinations thereof.

The first cap layer 124a is formed on the first gate 120a and between the first spacers 116a, and the second cap layer 124b is formed on the second gate 120b and between the second spacers 116b. The first cap layer 124a and the second cap layer 124b are formed of the same dielectric material, such as silicon nitride or SiCON. The first cap layer 124a and the second cap layer 124b may include a single layer or multilayer structure, for example.

In some embodiments, the pair of first spacers 116a and the pair of second spacers 116b are formed of the same dielectric material, such as silicon nitride or SiCON. The pair of first spacers 116a and the pair of second spacers 116b may include a single layer or multilayer structure, for example.

Figure 1F:
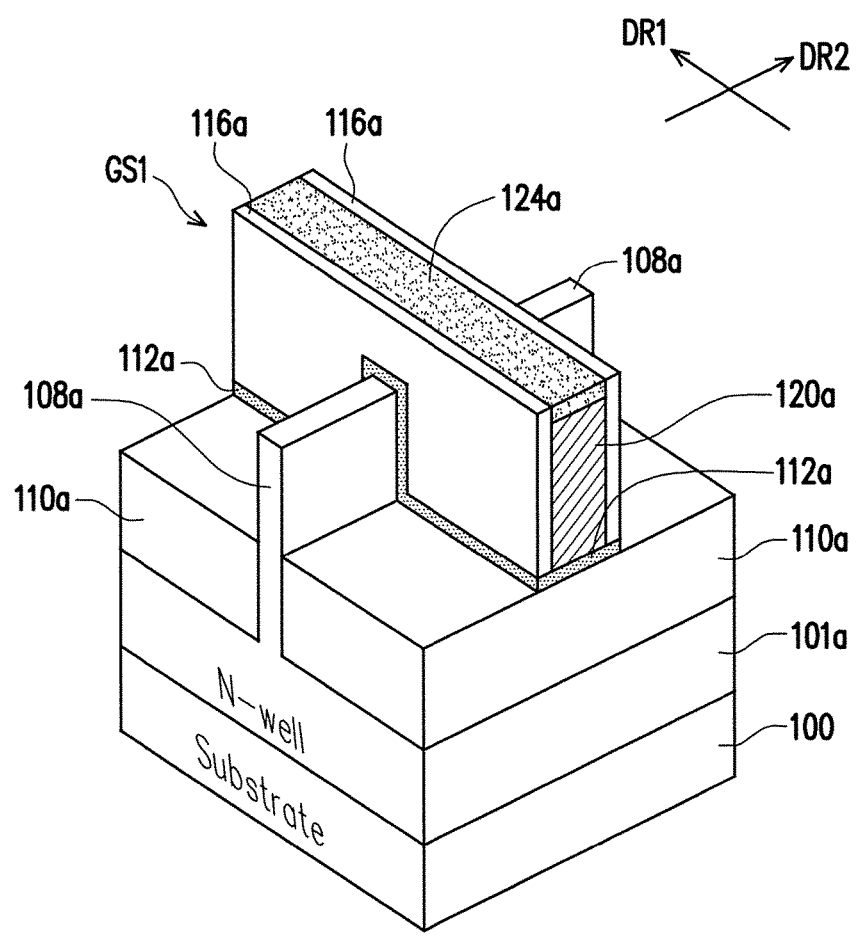
Figure 2F:
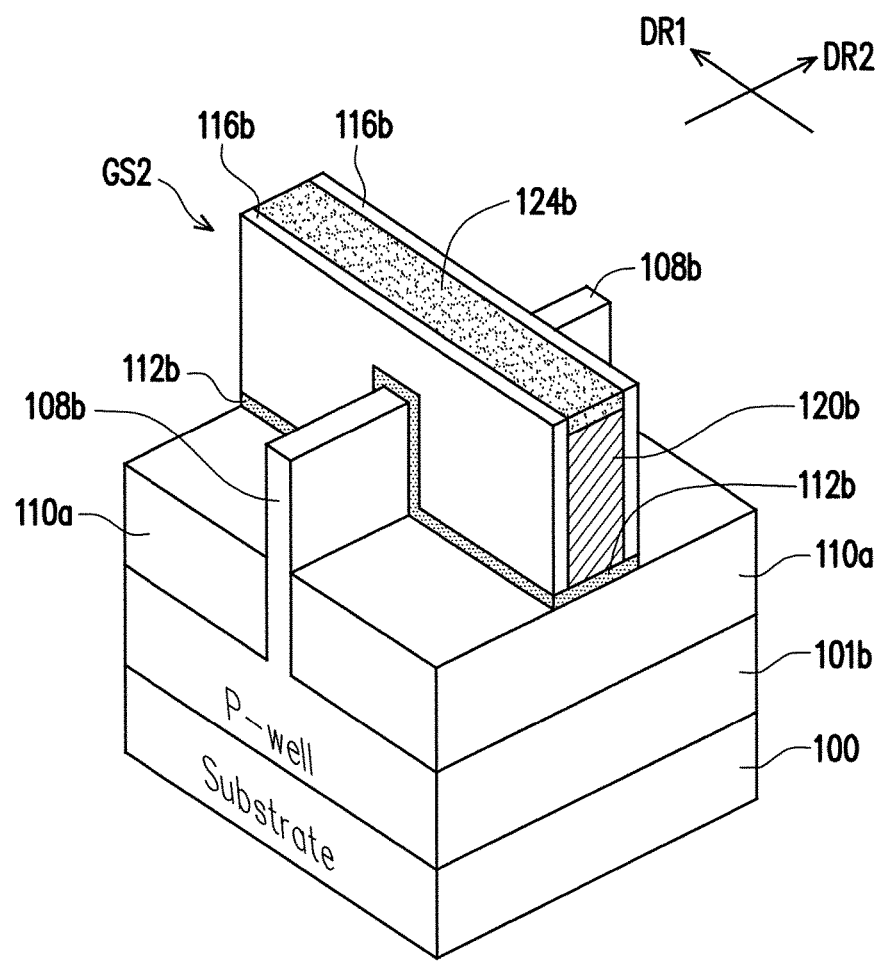

A lengthwise direction DR1 of the first gate 120 and the second gate 122 is different from a lengthwise direction DR2 of the first and second fin structures 108a, 108b. In some embodiments, the lengthwise direction DR1 of the first and second gates 120, 122 is perpendicular to the lengthwise direction DR2 of the first and second fin structures 108a, 108b. The number of the first and second gates 120, 122 shown in FIG. 1F and FIG. 2F is merely for illustration, in some alternative embodiments, more gate stacks may be formed in accordance with actual design requirements.

Figure 1G:
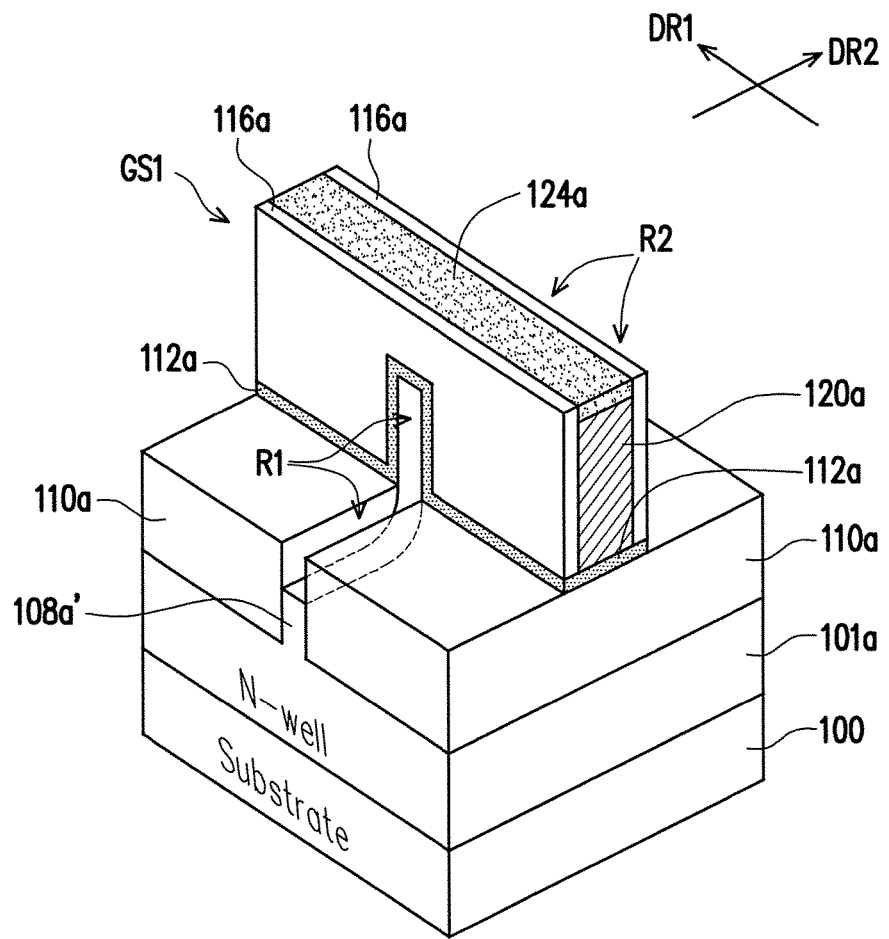
Figure 2G:
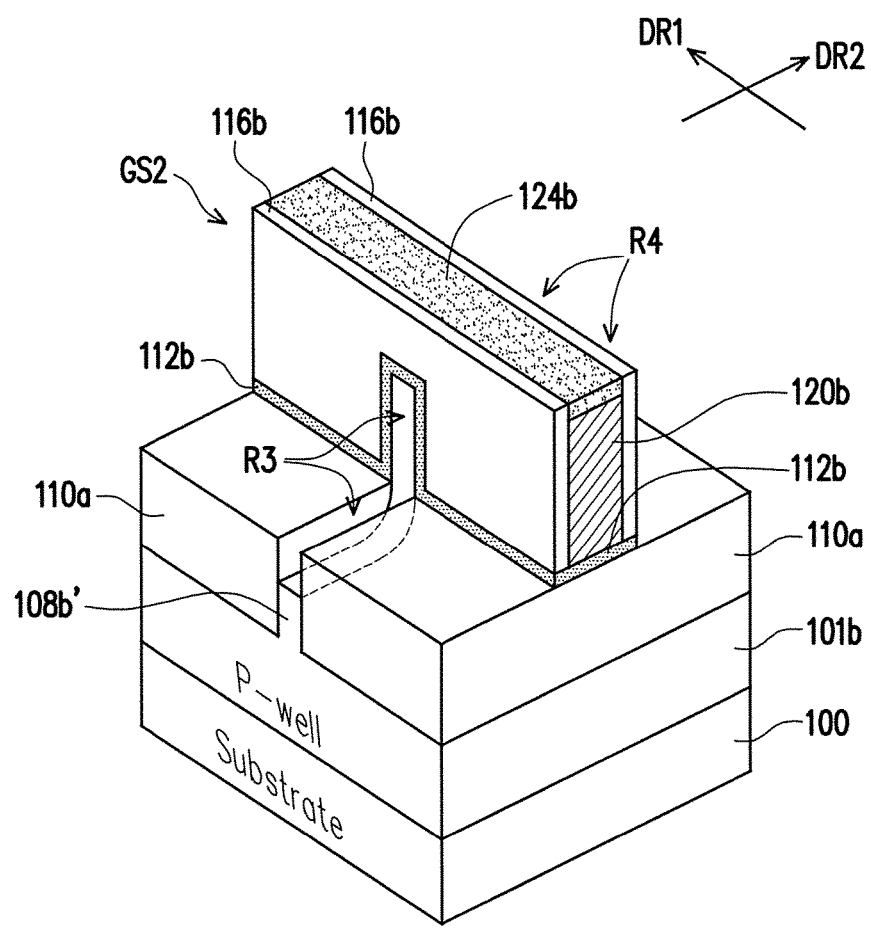

Referring to FIGS. 1F-1G, FIGS. 2F-2G, after the first gate stack GS1 is formed, a first fin recess process is performed on the first fin structure 108a so as to partially remove portions of the first fin structure 108a uncovered by the first gate stack GS1. After the first fin recess process is performed, in some embodiments, a first recessed portion R1 and a second recessed portion R2 are formed in the first fin structure 108a', as shown in FIG. 1G. After the second gate stack GS2 is formed, a second fin recess process is performed on the second fin structure 108b so as to partially remove portions of the second fin structure 108b uncovered by the first gate stack GS2. After the second fin recess process is performed, in some embodiments, a third recessed portion R3 and a fourth recessed portion R4 are formed in the second fin structure 108b', as shown in FIG. 2G. The etching recipe of the first fin recess process and the second recess process are illustrated as followings. The etchant includes $N_2$, $O_2$, He, Ar, $CH_4$, $CF_4$, HBr, $CH_3F$, $CHF_3$, $BCl_3$, $Cl_2$, $NF_3$, $SO_2$, $SF_6$, $SiCl_4$, or combinations thereof; power ranges from 100 W to 1500 W; process temperature ranges from 10 degree to 80 degree Celsius; and pressure ranges from 1 mtorr to 75 mtorr.

Figure 1H:
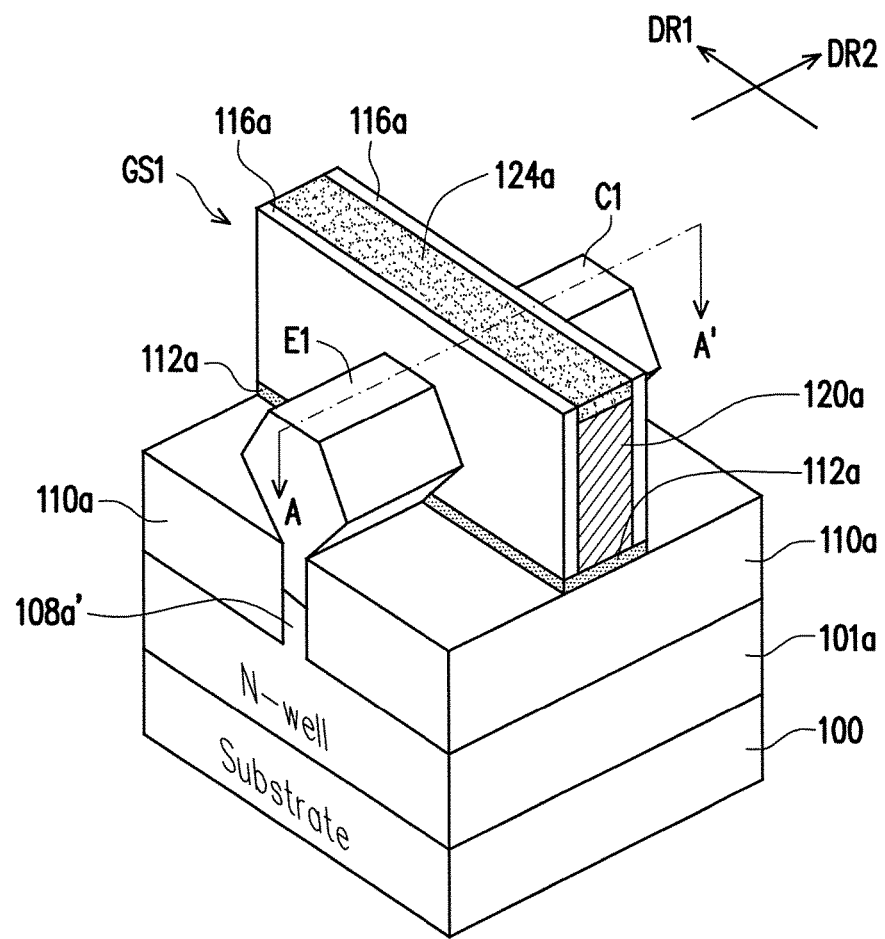
Figure 2H:
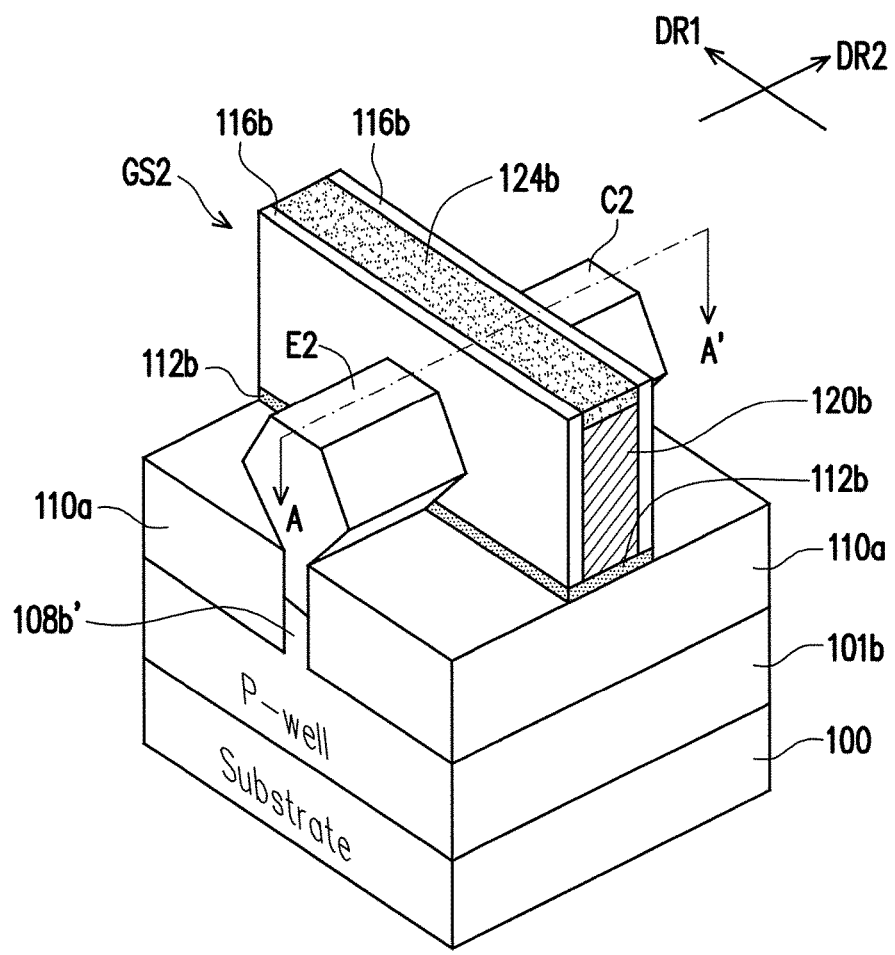
Figure 3A:
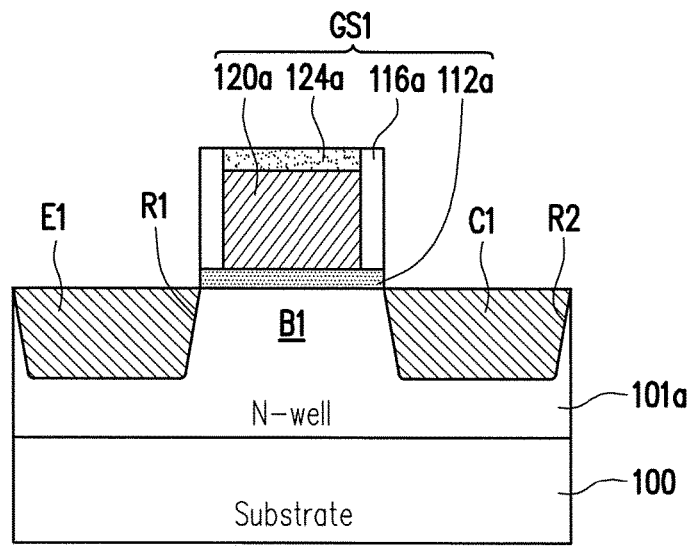
Figure 4A:
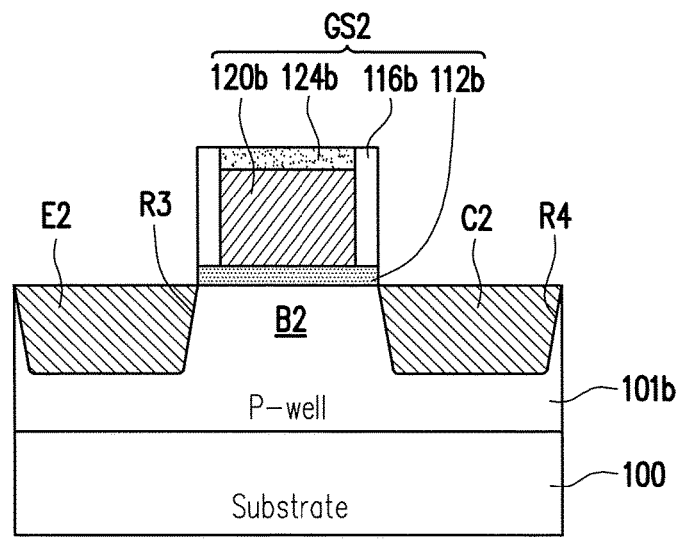

Referring to FIGS. 1G-1H, FIGS. 2G-2H, FIG. 3A and FIG. 4A, after the first and second fin recess processes are performed, a first epitaxial emitter E1 and a first epitaxial collector C1 are formed in the first recessed portion R1 and the second recessed portion R2 of the first fin structure 108a', and the first epitaxial emitter E1 and the first epitaxial collector C1 are formed at two opposite sides of the first gate stack GS1 (as shown in FIG. 1H and FIG. 3A). A second epitaxial emitter E2 and a second epitaxial collector C2 are formed in the third recessed portion R3 and the fourth recessed portion R4 of the second fin structure 108b', and are formed at two opposite sides of the second gate stack GS2 (as shown in FIG. 2H and FIG. 4A). In some embodiments, the first epitaxial emitter E1 and the first epitaxial collector C1 are formed by a first epitaxial process. The second epitaxial emitter E2 and the second epitaxial collector C2 are formed by a second epitaxial process. Therefore, the first epitaxial emitter E1 and the first epitaxial collector C1 are selectively grown from the semiconductor fin 108a' while the second epitaxial emitter E2 and the second epitaxial collector C2 are selectively grown from the semiconductor fin 108b'.

In some embodiments, as shown in FIG. 1H and FIG. 3A, the first epitaxial emitter E1 and the first epitaxial collector C1 are epitaxial-grown silicon germanium (SiGe) by CVD process, and according to one embodiment, the first epitaxial emitter E1 and the first epitaxial collector C1 are epitaxial-grown SiGe by CVD process with in-situ doping p-type dopant. The first fin structure 108a' between the first epitaxial emitter E1 and the first epitaxial collector C1 acts as a first base portion B1, and the first epitaxial emitter E1, the first epitaxial collector C1 and the first base portion B1 forms a lateral PNP BJT.

In some embodiments, as shown in FIG. 2H and FIG. 4A, the second epitaxial emitter E2 and the second epitaxial collector C2 are epitaxial-grown SiP or SiC by CVD process, and according to one embodiment, the second epitaxial emitter E2 and the second epitaxial collector C2 are epitaxial-grown SiP or SiC by CVD process with in-situ doping n-type dopant. The second fin structure 108b' between the second epitaxial emitter E2 and the second epitaxial collector C2 acts as a second base portion B2, and the second epitaxial emitter E2, the second epitaxial collector C2 and the second base portion B2 forms a lateral NPN BJT.

Figure 1I:
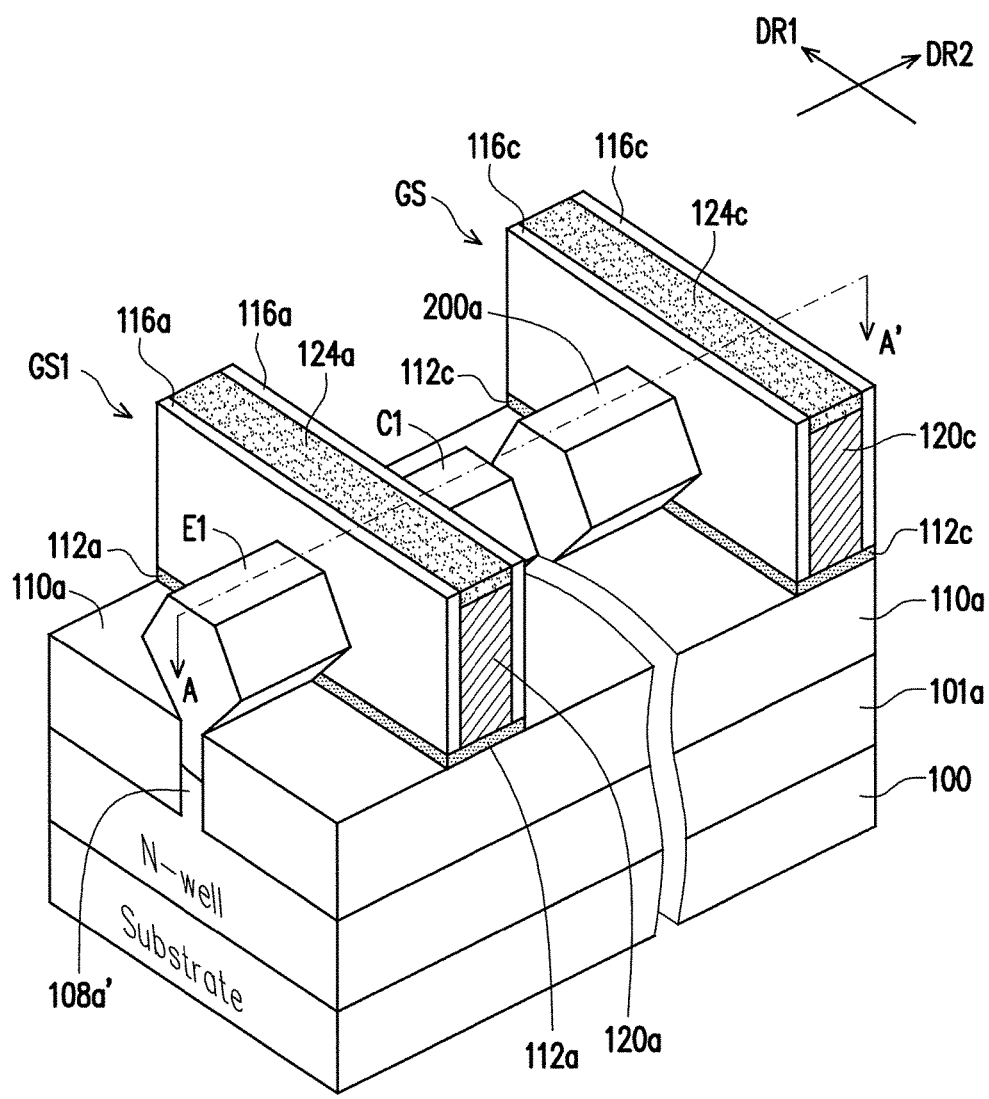
Figure 2I:
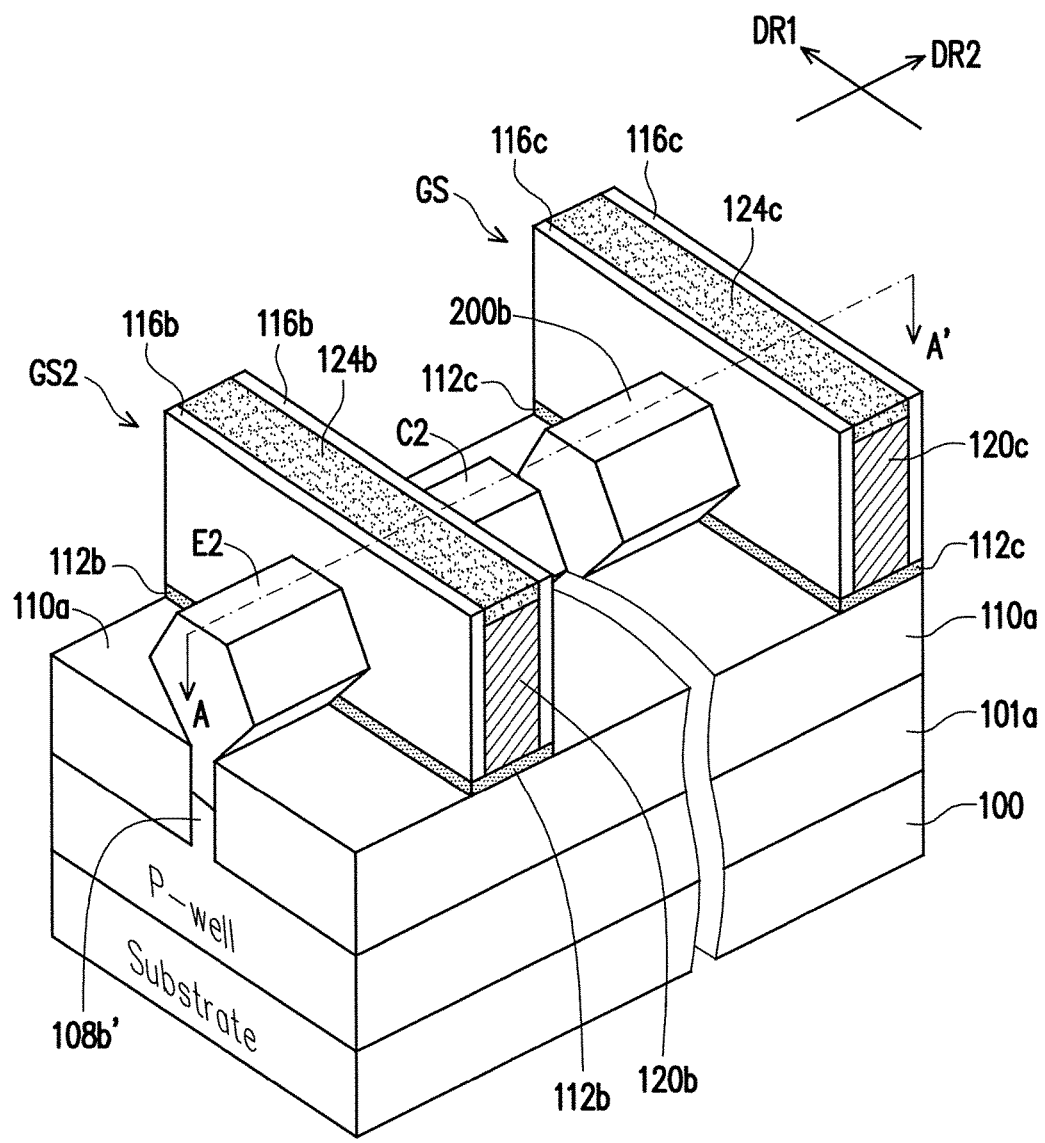
Figure 3B:
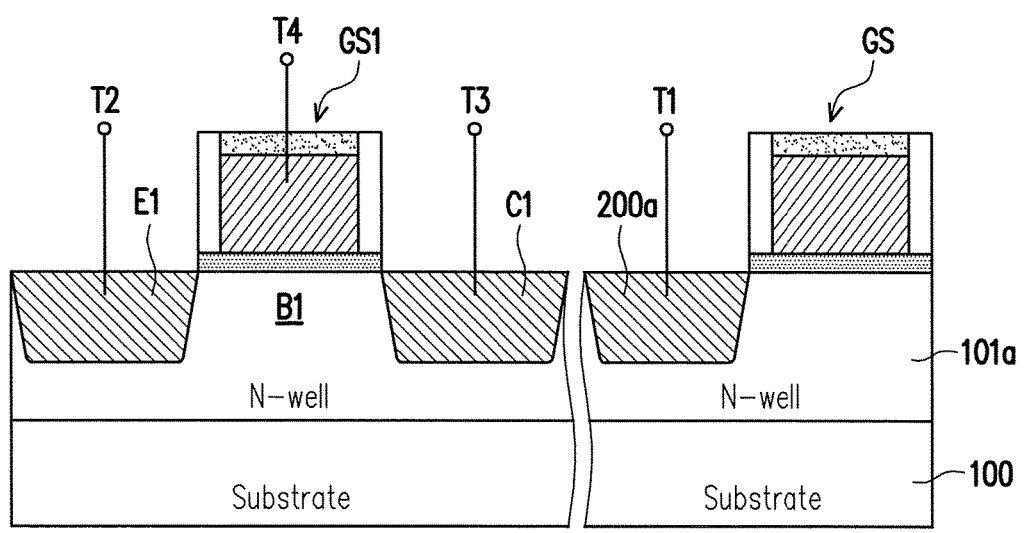

According to some embodiments, referring to FIG. 1I, FIG. 2I, FIG. 3B and FIG. 4B, a first epitaxial contact structure 200a is further formed on the semiconductor substrate 100, and the first base portion B1 of the first fin structure 108a' is electrically connected the first epitaxial contact structure 200a (shown in FIG. 1I and FIG. 3B). A second epitaxial contact structure 200b is further formed on the semiconductor substrate 100, and the second base portion B2 of the second fin structure 108b' is electrically connected the second epitaxial contact structure 200b (shown in FIG. 2I and FIG. 4B).

As shown in FIG. 1I and FIG. 3B, the first epitaxial contact structure 200a is formed in the n-well 101a of the semiconductor substrate 100. According to one embodiment, the first epitaxial contact structure 200a is formed by the following steps. Before forming the first epitaxial contact structure 200a, a dummy gate stack GS including a gate 120c, a gate dielectric layer 112c, a cap layer 124c and a pair of spacers 116c is formed when the first gate stack GS1 is formed, and a recessed portion of the fin structure (not shown) under the dummy gate stack GS is formed when the recessed portions of the first fin structure 108a' is formed. After or before forming the first epitaxial collector C1 and the first emitter E1, the first epitaxial contact structure 200a is formed by epitaxial-growing SiP or SiC with CVD process. According to one embodiment, the first epitaxial contact structure 200a is epitaxial-grown SiP or SiC by CVD process with in-situ doping n-type dopant. Hence, the first base portion B1 of the lateral PNP BJT can be electrically biased through the first epitaxial contact structure 200a.

In some embodiments, as shown in FIG. 3B, the first base portion B1 is electrically coupled with a first terminal T1 through the first epitaxial contact structure 200a, the first epitaxial emitter E1 is electrically coupled with a second terminal T2, the first epitaxial collector C1 is electrically coupled with a third terminal T3, and the first gate stack GS1 is electrically coupled with a forth terminal T4. The terminals T1, T2, T3 and T4 are formed by conductive terminal contacts (not shown). The conductive terminal contacts may comprise various conductive materials, such as copper, tungsten, and/or silicide. In operation, the terminals T1, T2, T3 and T4 may be biased at various voltages so that the integrated circuit device operates as a lateral PNP BJT. The forth terminal T4 is used to bias the gate of the first gate stack GS1 so that the gate of the first gate stack GS1 controls a conduction path between the first epitaxial collector C1 and the first epitaxial emitter E1 of the lateral PNP BJT. Accordingly, the lateral PNP BJT with the first gate stack GS1 for controlling the conduction path may improve current gain of the PNP BJT, and the operation range of the PNP BJT may also be widen.

Figure 4B:
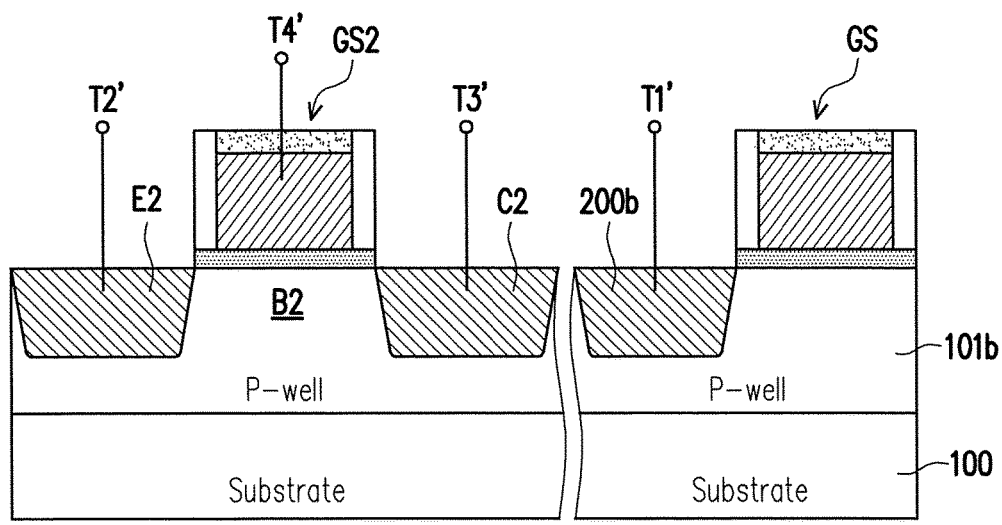

As shown in FIG. 2I and FIG. 4B, the second epitaxial contact structure 200b is formed in the p-well 101b of the semiconductor substrate 100. According to one embodiment, the second epitaxial contact structure 200b is formed by the following steps. Before forming the second epitaxial contact structure 200b, a dummy gate stack GS including a gate 120c, a gate dielectric layer 112c, a cap layer 124c and a pair of spacers 116c is formed when the second gate stack GS2 is formed, and a recessed portion of the fin structure (not shown) under the dummy gate stack GS is formed when the recessed portions of the second fin structure 108b' is formed. After or before forming the second epitaxial collector C2 and the second emitter E2, the second epitaxial contact structure 200b is formed by epitaxial-growing SiGe with CVD process. According to one embodiment, the second epitaxial contact structure 200b is epitaxial-grown SiGe by CVD process with in-situ doping p-type dopant. Hence, the second base portion B2 of the lateral NPN BJT can be electrically biased through the second epitaxial contact structure 200b.

In some embodiment, as shown in FIG. 4B the second base portion B2 is electrically coupled with a first terminal T1' through the second epitaxial contact structure 200b, the second epitaxial emitter E2 is electrically coupled with a second terminal T2', the second epitaxial collector C2 is electrically coupled with a third terminal T3', and the second gate stack GS2 is electrically coupled with a forth terminal T4'. The terminals T1', T2', T3' and T4' are formed by conductive terminal contacts (not shown). The conductive terminal contacts may comprise various conductive materials, such as copper, tungsten, and/or silicide. In operation, the terminals T1', T2', T3' and T4' are biased at various voltages so that the integrated circuit device operates as a lateral NPN BJT. The forth terminal T4' is used to bias the gate of the second gate stack GS2 so that the gate of the second gate stack GS2 controls a conduction path between the second epitaxial collector C2 and the second epitaxial emitter E2 of the lateral NPN BJT. Accordingly, the lateral NPN BJT with the second gate stack GS2 for controlling the conduction path may improve current gain of the NPN BJT, and the operation range of the NPN BJT may also be widen.

Figure 5:
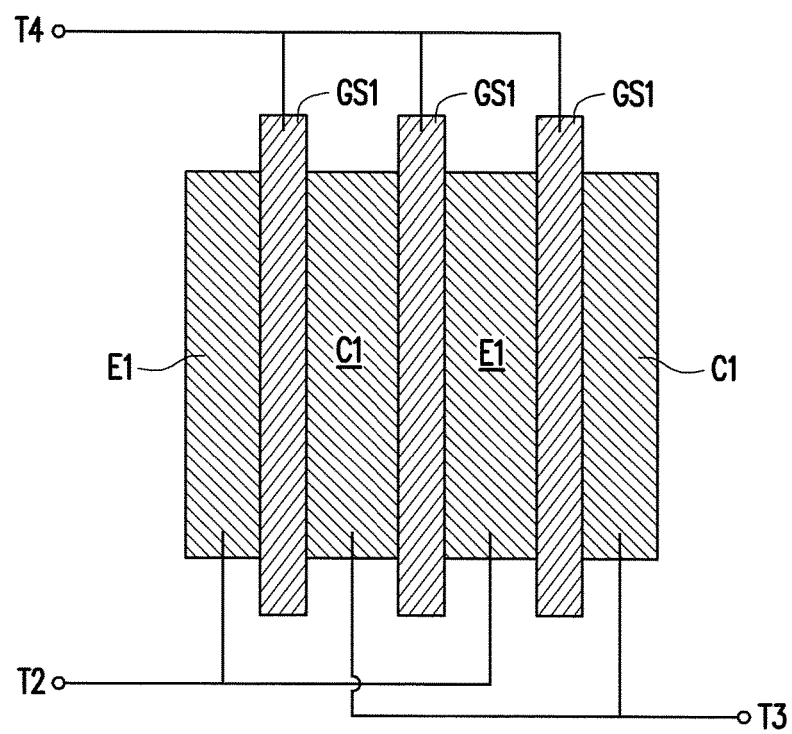

FIG. 5 is a top view of an integrated circuit device of in accordance with some embodiments. The integrated circuit device comprises a plurality of PNP BJTs, each of the PNP BJTs has a structure the same or similar to the PNP BJT shown in FIG. 1I and FIG. 3B. The first base portions (not shown in FIG. 5) of the PNP BJTs are electrically connected to the first terminal T1, the first epitaxial emitters E1 of the PNP BJTs are electrically connected to the second terminal T2, the first epitaxial collectors C1 of the PNP BJTs are electrically connected to the third terminal T3, the gates of the first gate stacks GS1 are electrically connected to the forth terminal T4.

Figure 6:
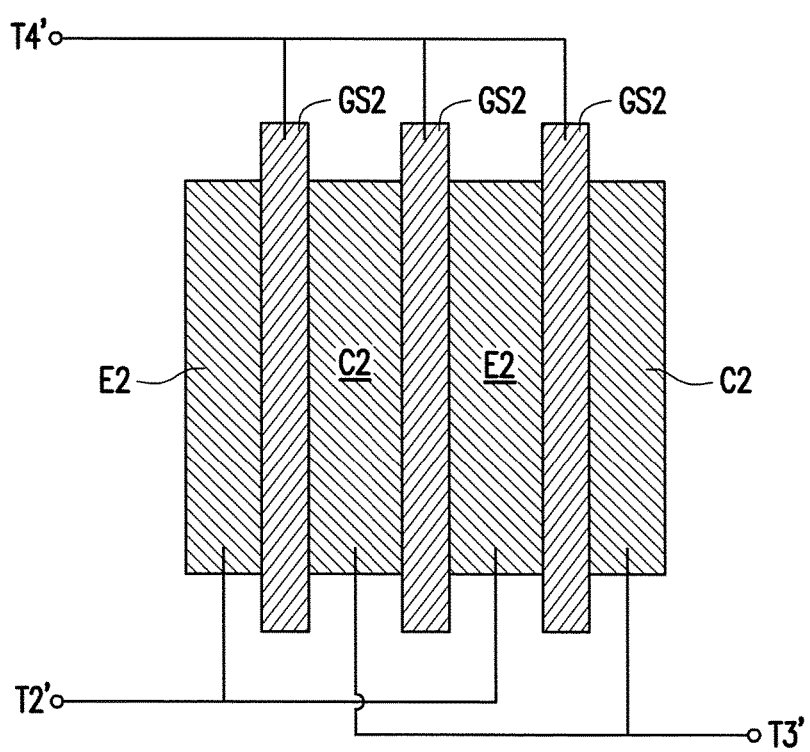

FIG. 6 is a top view of an integrated circuit device of in accordance with some embodiments. The integrated circuit device comprises a plurality of NPN BJTs, each of the NPN BJTs has a structure the same or similar to the NPN BJT shown in FIG. 2I and FIG. 4B. The second base portions (not shown in FIG. 6) of the NPN BJTs are electrically connected to the first terminal Ti', the second epitaxial emitters E2 of the NPN BJTs are electrically connected to the second terminal T2', the second epitaxial collectors C2 of the NPN BJTs are electrically connected to the third terminal T3', the gates of the second gate stacks GS2 are electrically connected to the forth terminal T4'.

In accordance with some embodiments of the present disclosure, a bipolar junction transistor includes a semiconductor substrate, a fin structure, an epitaxial emitter, an epitaxial collector and a gate. The fin structure is disposed on the semiconductor substrate and has a base portion of a first conductivity type, a first recessed portion and a second recessed portion. The epitaxial emitter of a second conductivity type is disposed in the first recessed portion of the fin structure. The epitaxial collector of the second conductivity type is disposed in the second recessed portion of the fin structure. The gate is disposed on the base portion of the fin structure and isolated from the base portion of the fin structure.

In accordance with some embodiments of the present disclosure, an integrated circuit device includes a semiconductor substrate, a plurality of fin structures, a plurality of epitaxial emitters, a plurality of epitaxial collectors and a plurality of gates. The plurality of fin structures are disposed on the semiconductor substrate, and each of the fin structures has a base portion of a first conductivity type, a first recessed portion and a second recessed portion. The base portions are electrically connected to each other. The epitaxial emitters of a second conductivity type are disposed in the first recessed portions of the fin structures, and the epitaxial emitters are electrically connected to each other. The epitaxial collectors of the second conductivity type are disposed in the second recessed portions of the fin structures, and the epitaxial collectors are electrically connected to each other. The gates are disposed on the base portions of the fin structures and isolated from the base portions of the fin structures, and the gates are electrically connected to each other.

In accordance with some embodiments of the present disclosure, an integrated circuit device includes a semiconductor substrate, a plurality of fin structures, a plurality of epitaxial emitters, a plurality of epitaxial collectors, a plurality of gates, a first terminal, a second terminal, a third terminal, and a forth terminal. The fin structures are disposed on the semiconductor substrate, and each of the fin structures has a base portion of a first conductivity type, a first recessed portion and a second recessed portion. The epitaxial emitters of a second conductivity type are disposed in the first recessed portions of the fin structures. The epitaxial collectors of the second conductivity type are disposed in the second recessed portions of the fin structures. The gates are disposed on the base portions of the fin structures and isolated from the base portions of the fin structures. The first terminal is electrically connected to the plurality of base portions for electrically biasing the plurality of base portions. The second terminal is electrically connected to the plurality of epitaxial emitters for electrically biasing the plurality of epitaxial emitters. The third terminal is electrically connected to the plurality of epitaxial collectors for electrically biasing the plurality of epitaxial collectors. The forth terminal is electrically connected to the plurality of the gates for electrically biasing the gates such that the gates control paths of currents through the base portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A bipolar junction transistor, comprising:
   a semiconductor substrate;
   a fin structure disposed on the semiconductor substrate, the fin structure comprising a base portion of a first conductivity type, a first recessed portion and a second recessed portion;
   an epitaxial emitter of a second conductivity type disposed in the first recessed portion of the fin structure;
   an epitaxial collector of the second conductivity type disposed in the second recessed portion of the fin structure;
   a gate disposed on the base portion of the fin structure and isolated from the base portion of the fin structure; and
   a gate terminal electrically connected to the gate for electrically biasing the gate such that the gate controls a path of current between the epitaxial collector and the epitaxial emitter.

2. The bipolar junction transistor of claim 1, wherein the base portion of the first conductivity type is p-type, and the epitaxial emitter of the second conductivity type and the epitaxial collector of the second conductivity type comprise SiP or SiC.

3. The bipolar junction transistor of claim 1, wherein the base portion of the first conductivity type is n-type, and the epitaxial emitter of the second conductivity type and the epitaxial collector of the second conductivity type comprise SiGe.

4. The bipolar junction transistor of claim 1, further comprising an epitaxial contact structure of the first conductivity type disposed in the semiconductor substrate, the base portion of the fin structure being electrically connected the epitaxial contact structure.

5. The bipolar junction transistor of claim 4, wherein the first conductivity type is p-type, and the epitaxial contact structure of the first conductivity type comprises SiGe.

6. The bipolar junction transistor of claim 4, wherein the first conductivity type is n-type, and the epitaxial contact structure of the first conductivity type comprises SiP or SiC.

7. The bipolar junction transistor of claim 1, wherein the base portion of the fin structure is disposed between the epitaxial emitter and the epitaxial collector.

8. The bipolar junction transistor of claim 1, wherein:
   the base portion is electrically coupled with a first terminal for electrically biasing the base portion;
   the epitaxial emitter is electrically coupled with a second terminal for electrically biasing the epitaxial emitter; and
   the epitaxial collector is electrically coupled with a third terminal for electrically biasing the epitaxial collector.

9. An integrated circuit device, comprising:
   a semiconductor substrate;
   a plurality of fin structures on the semiconductor substrate, each of the fin structures comprising a base portion of a first conductivity type, a first recessed portion and a second recessed portion, the plurality of base portions being electrically connected to each other;
   a plurality of epitaxial emitters of a second conductivity type disposed in the first recessed portions of the fin structures, the plurality of epitaxial emitters being electrically connected to each other;
   a plurality of epitaxial collectors of the second conductivity type disposed in the second recessed portions of the fin structures, the plurality of epitaxial collectors being electrically connected to each other;
   a plurality of gates disposed on the base portions of the fin structures and isolated from the base portions of the fin structures, the plurality of gates being electrically connected to each other; and
   an epitaxial contact structure of the first conductivity type disposed in the semiconductor substrate, the base portions of the fin structure being connected the epitaxial contact structure and being electrically biased through the epitaxial contact structure.

10. The integrated circuit device of claim 9, wherein the base portions of the first conductivity type are p-type, and the epitaxial emitters of the second conductivity type and the epitaxial collectors of the second conductivity type comprise SiP or SiC.

11. The integrated circuit device of claim 9, wherein the base portions of the first conductivity type are n-type, and the epitaxial emitters of the second conductivity type and the epitaxial collectors of the second conductivity type comprise SiGe.

12. The integrated circuit device of claim 9, wherein the first conductivity type is p-type, and the epitaxial contact structure of the first conductivity type comprises SiGe.

13. The integrated circuit device of claim 9, wherein the first conductivity type is n-type, and the epitaxial contact structure of the first conductivity type comprises SiP or SiC.

14. An integrated circuit device, comprising:
   a semiconductor substrate;
   a plurality of fin structures on the semiconductor substrate, each of the fin structures comprising a base portion of a first conductivity type, a first recessed portion and a second recessed portion;
   a plurality of epitaxial emitters of a second conductivity type disposed in the first recessed portions of the fin structures;
   a plurality of epitaxial collectors of the second conductivity type disposed in the second recessed portions of the fin structures;
   a plurality of gates disposed on the base portions of the fin structures and isolated from the base portions of the fin structures;
   a first terminal electrically connected to the plurality of base portions for electrically biasing the plurality of base portions;
   a second terminal electrically connected to the plurality of epitaxial emitters for electrically biasing the plurality of epitaxial emitters;
   a third terminal electrically connected to the plurality of epitaxial collectors for electrically biasing the plurality of epitaxial collectors; and
   a forth terminal electrically connected to the plurality of the gates for electrically biasing the gates such that the gates control paths of currents through the base portions.

15. The integrated circuit device of claim 14, wherein the base portions of the first conductivity type are p-type, and the epitaxial emitters of the second conductivity type and the epitaxial collectors of the second conductivity type comprise SiP or SiC.

16. The integrated circuit device of claim 14, wherein the base portions of the first conductivity type are n-type, and the epitaxial emitters of the second conductivity type and the epitaxial collectors of the second conductivity type comprise SiGe.

17. The integrated circuit device of claim 14, further comprising an epitaxial contact structure of the first conductivity type disposed in the semiconductor substrate, the base portions of the fin structure being connected the epitaxial contact structure.

18. The integrated circuit device of claim 17, wherein the first conductivity type is p-type, and the epitaxial contact structure of the first conductivity type comprises SiGe.

19. The integrated circuit device of claim 17, wherein the first conductivity type is n-type, and the epitaxial contact structure of the first conductivity type comprises SiP or SiC.

\* \* \* \* \*